(12) United States Patent
Galy

(10) Patent No.: US 9,660,034 B1
(45) Date of Patent: May 23, 2017

(54) ELECTRONIC CHIP COMPRISING TRANSISTORS WITH FRONT AND BACK GATES

(71) Applicant: STMicroelectronics SA, Montrouge (FR)

(72) Inventor: Philippe Galy, Le Touvet (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/229,746

(22) Filed: Aug. 5, 2016

(30) Foreign Application Priority Data

Feb. 25, 2016 (FR) ...................... 16 51576

(51) Int. Cl.
| H01L 29/10 | (2006.01) |
| H01L 29/78 | (2006.01) |
| H01L 27/12 | (2006.01) |
| H01L 21/84 | (2006.01) |

(52) U.S. Cl.
CPC .......... *H01L 29/1083* (2013.01); *H01L 21/84* (2013.01); *H01L 27/1203* (2013.01); *H01L 29/7838* (2013.01)

(58) Field of Classification Search
CPC . H01L 21/84; H01L 27/1203; H01L 29/1083; H01L 29/7838
See application file for complete search history.

(56) References Cited

U.S. PATENT DOCUMENTS

| 2007/0210418 A1* | 9/2007 | Nakajima | ............... H01L 21/84 257/547 |
| 2009/0003105 A1* | 1/2009 | Itoh | ..................... G11C 11/4091 365/203 |
| 2012/0146147 A1 | 6/2012 | Hook | |
| 2013/0001665 A1 | 1/2013 | Zhu et al. | |
| 2013/0175594 A1* | 7/2013 | Basker | ..................... H01L 21/84 257/301 |
| 2013/0214356 A1 | 8/2013 | Cheng et al. | |
| 2015/0001623 A1* | 1/2015 | Wang | ................ H01L 29/78654 257/347 |
| 2015/0061006 A1* | 3/2015 | Shinohara | ........... H01L 29/7824 257/336 |

FOREIGN PATENT DOCUMENTS

| WO | WO-2012160071 A1 | 11/2012 |
| WO | WO-2014131461 A1 | 9/2014 |

OTHER PUBLICATIONS

INPI Search Report and Written Opinion from FR 1651576 dated Oct. 12, 2016 (9 pages).

* cited by examiner

*Primary Examiner* — Christine Enad
(74) *Attorney, Agent, or Firm* — Gardere Wynne Sewell LLP

(57) ABSTRACT

An integrated circuit includes SOI-type MOS transistors on insulator, with a first well capable of being biased located under the insulator. The first wells are doped with a first conductivity type. Each first well includes, under the insulator of each transistor, a back gate region that is more heavily doped than the first well. The first wells are separated from each other by inclusion in in a second well that is also capable of being biased. The second well is doped with a second conductivity type.

17 Claims, 4 Drawing Sheets

US 9,660,034 B1

ELECTRONIC CHIP COMPRISING TRANSISTORS WITH FRONT AND BACK GATES

PRIORITY CLAIM

This application claims the priority benefit of French Application for Patent No. 1651576, filed on Feb. 25, 2016, the disclosure of which is hereby incorporated by reference in its entirety to the maximum extent allowable by law.

TECHNICAL FIELD

The present application relates to electronic chips, and more particularly electronic chips comprising memory cells and MOS transistors of semiconductor-on-insulator (SOI) type having front and back gates.

BACKGROUND

In an electronic chip in operation, MOS transistors are successively in off and on states to carry out functions such as logic operations. The off state or the on state of a transistor depends on the voltage applied between a gate arranged above a channel-forming area (referred to as the front gate) and a source of the transistor. When the voltage is greater in absolute value than a front gate threshold voltage, the transistor is on. The transistor is in an off state when the voltage is smaller than the threshold voltage.

When the transistor has a structure of silicon-on-insulator type (SOI), that is, the transistor is formed inside and on top of a thin silicon layer covering an insulating layer arranged on a support, a back gate may be formed under the transistor. The back gate is a doped region separated from the transistor by the insulating layer. Characteristics such that the front gate threshold voltage of the transistor then depend on the thickness of the insulating layer, on the doping type of the back gate, and on the potential applied to the back gate. The application of a potential on the back gate enables to accelerate the operation of the transistor or to decrease the power consumption thereof. The back gate may further enable to operate the transistor as a memory cell.

Various solutions have been provided for the forming of transistors having front and back gates. Such solutions raise various implementation issues.

SUMMARY

Thus, an embodiment provides an electronic chip comprising SOI-type MOS transistors on insulator arranged on first wells capable of being biased, all doped with a first conductivity type, each first well including under the insulator of each transistor a back gate region more heavily doped than the first well, the first wells being separate and included in a second well capable of being biased, doped with a second conductivity type.

According to an embodiment, one of the back gate regions is doped with the second conductivity type and is adjacent to an overdoped region of the first conductivity type located under the insulator of the MOS transistors.

According to an embodiment, said back gate region is entirely arranged under a channel-forming area.

According to an embodiment, each of said back gate region and of said overdoped region is partly arranged under a channel-forming area.

According to an embodiment, said overdoped region is surrounded with said back gate region and is located under a central portion of a channel-forming area.

According to an embodiment, said overdoped region is P-type doped to a doping level greater than $10^{19}$ atoms/cm$^3$ and said back gate region is N-type doped to a doping level greater than $10^{19}$ atoms/cm$^3$.

According to an embodiment, the MOS transistors on insulator are of FDSOI type.

Another embodiment provides a method of forming an electronic chip, wherein said back gate region and said overdoped region are obtained by partly overlapping ion implantations.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
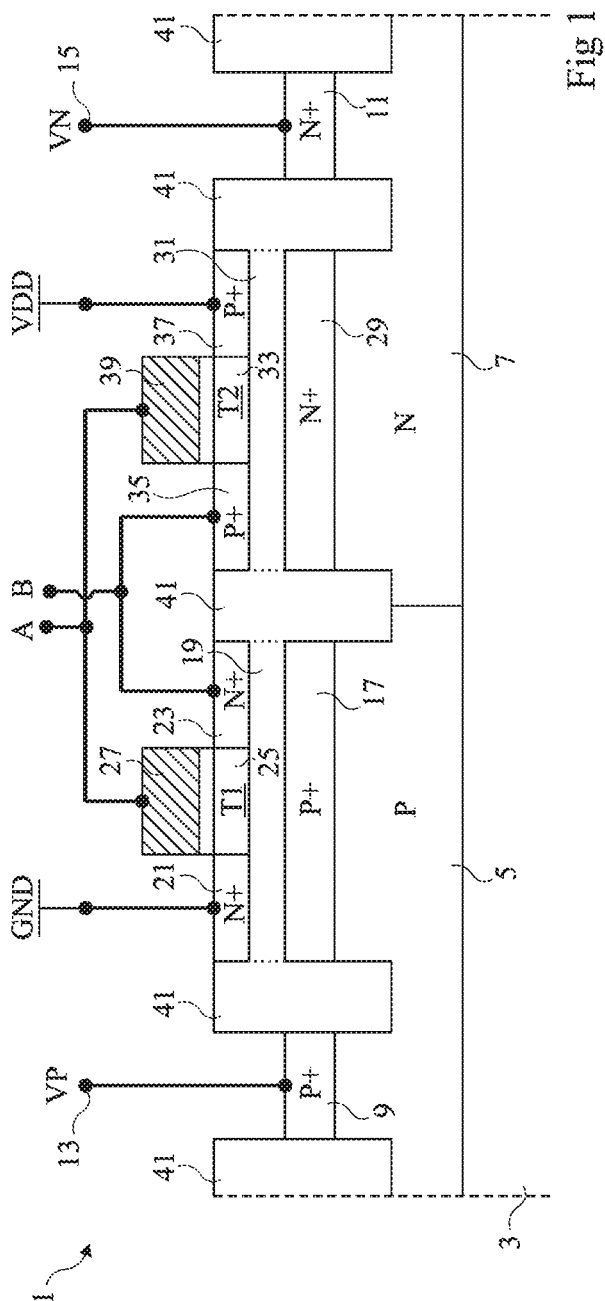
FIG. 1 shows a partial simplified cross-section view of an electronic chip comprising transistors with front and back gates.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying the relative position, such as terms "on", "under", "above", "below", "upper", "lower", etc., reference is made to the orientation of the concerned elements in the concerned drawings.

FIG. 1 shows a partial simplified cross-section view of transistors with front and back gates formed in a portion of an electronic chip 1.

In the upper portion of a silicon wafer 3, P-type doped wells 5 are juxtaposed with N-type doped wells 7. Only a well 5 and a well 7 are shown in FIG. 1. P-type well 5 is provided with a contact area 9 and N-type well 7 is provided with a contact area 11. Contact areas 9 and 11 are connected to respective nodes 13 and 15 of application of potentials VP and VN.

An area 17 more heavily P-type doped than well 5 is located in an upper portion of well 5. Doped area 17 is located under an N-channel SOI-type MOS transistor T1. Transistor T1 comprises on an insulator 19 a source area 21 and a drain area 23 separated by a channel-forming area 25 arranged under a front gate stack 27. Doped area 17 forms a back gate of transistor T1.

An SOI-type P-channel MOS transistor T2 is located above well 7 in a layout similar to that of transistor T1 above well 5. Well 7 includes under transistor T2 a doped area 29 more heavily N-type doped than well 7. Transistor T2 comprises on an insulator 31 a channel-forming area 33 which extends between a drain area 35 and a source area 37 under a front gate stack 39. Doped area 29 forms a back gate of transistor T2.

Transistors T1 and T2 and contact areas 9 and 11 are separated by insulating trenches 41 penetrating into P and N wells 5 and 7.

Connections between transistors T1 and T2 enable to form logic circuits. As an example, a transistor T1 and a transistor T2 are gathered in an inverter coupling two nodes A and B. The inverter is powered between a high potential VDD and a reference potential such as a ground GND.

Along the inverter operation, potentials VP and VN are desired to be optimized to accelerate the operation of the inverter or to decrease the power consumption thereof. In particular, the application of a positive potential VP on well 5 associated with transistor T1, that is, on the back gate of this transistor, enables to accelerate the operation of N-channel transistor T1. The application of a negative potential VN on well 7 enables to accelerate the operation of P-channel transistor T2. The P-N junction between transistors 5 and 7 is then forward biased and a leakage current appears between wells 5 and 7. Thereby, the voltage applied between wells 5 and 7 cannot exceed approximately 0.3 V and the possible acceleration of the inverter operation is limited.

Transistors T1 and T2 may be used as memory cells. Such memory cells are programmable and erasable by variations potentials VP and VN applied on the wells. The existence of the P-N junction between wells 5 and 7 limits the possibilities of application of such potentials between neighboring wells 5 and 7.

It is desired to form an electronic chip comprising transistors with front and back gates arranged on wells and to apply between neighboring wells variable voltages having variable directions capable of reaching, for example, some ten volts.

Figure 2:
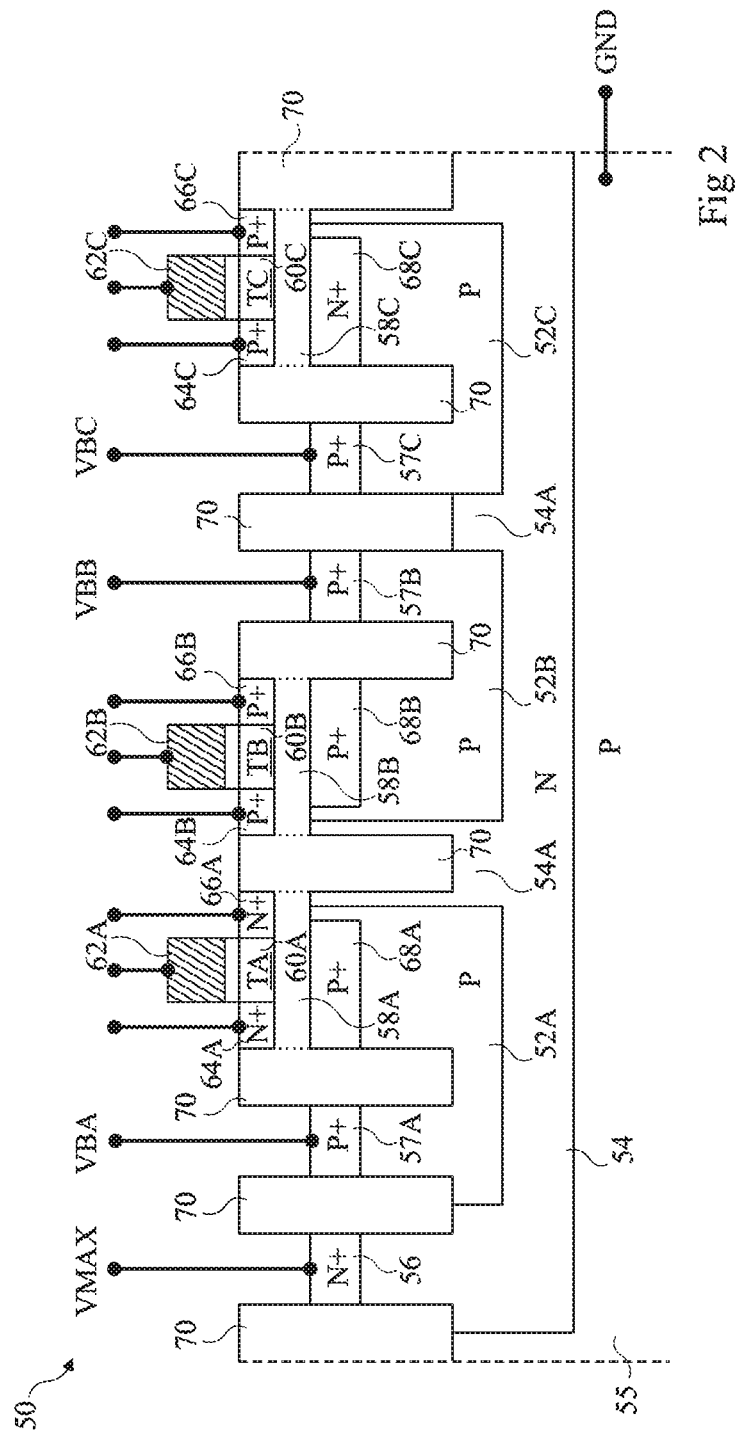
FIG. 2 is a partial simplified cross-section view of an embodiment of an electronic chip comprising transistors with front and back gates.

FIG. 2 is a partial simplified cross-section view of an embodiment of an electronic chip portion 50 comprising transistors with front and back gates. SOI-type transistors, TA, TB, and TC, intended to operate as a logic transistor for transistor TA and as memory cells for transistors TB and TC have been shown.

First wells 52A, 52B, and 52C are all P-type doped. Such wells are separate and are included in the upper portion of a second N-type doped well 54. Well 54 is formed in an upper portion of a P-type doped semiconductor wafer 55, for example, made of silicon. Portions 54A (here, N-type doped) of well 54 are arranged between wells 52A and 52B and between wells 52B and 52C. Two head-to-tail diodes are thus formed between two adjacent wells. Well 54 is connected by a contact area 56 (N⁺), more heavily N-type doped than well 54, to a node of application of a positive potential VMAX. Each of wells 52A, 52B, and 52C is provided with a respective contact area 57A, 57B, and 57C (P⁺), more heavily P-type doped than the well, and is can be biased to a respective potential VBA, VBB, and VBC.

An N-channel MOS transistor TA is located on well 52A. Transistor TA comprises, on an insulator 58A, a channel-forming area 60A which extends under a front gate 62A between a source area 64A and a drain area 66A. Well 52A comprises under transistor TA a back gate 68A more heavily P-type doped than well 52A.

On well 52B, P-channel MOS transistor TB comprises, on an insulator 58B, a channel-forming area 60B which extends under a front gate 62B between source 64B and drain 66B areas. Well 52B comprises under transistor TB a back gate 68B more heavily P-type doped than well 52B.

On well 52C, P-channel MOS transistor TC comprises, on an insulator 58C, a channel-forming area 60C under a front gate 62C between source 64C and drain 66C areas. Well 52C comprises, under transistor TC, an N-type doped read gate region 68C.

Contact areas 56 and 57A are separated by an insulating trench 70. Contact areas 57A, 57B, 57C are respectively separated from transistors TA, TB, and TC by insulating trenches 70. An embodiment with no insulating trench between transistors TA and TB and between transistors TB and TC may be provided, wells 52A, 52B, and 52C being then separated by portions 54A of well 54.

As an example, transistors TA, TB, and TC are of fully depleted SOI or FDSOI type, that is, the channel-forming area is made of intrinsic silicon having a thickness smaller than 15 nm. As an example, the insulating layer has a thickness ranging between 10 and 30 nm.

In operation, a reference potential, for example, ground GND, is applied to semiconductor wafer 55. Potential VMAX applied to N-type doped well 54 is greater than or equal, to within 0.3 V, to the potentials capable of being applied to wells 52A, 52B, and 52C. As an example, potential VMAX is greater than 5 V.

During the use of transistor TA, one may thus apply to well 52A and thus to the back gate of transistor TA any potential VBA having a value smaller than or equal, to within 0.3 V, to potential VMAX. In particular, a high potential, for example, higher than 4 V, may be applied to the back gate of transistor TA, which allows a particularly fast operation of transistor TA. A strongly negative potential, for example, lower than −4 V, may also be applied to decrease the consumption of transistor TA.

To program transistor TB used as a memory cell, a high voltage is applied between back gate 68B and source 64B, or back gate voltage. This enables to store charges in channel-forming area 60B. To delete the memory cell, a zero or negative back gate voltage is temporarily applied.

To program transistor TC used as a memory cell, a high voltage is applied between, on the one hand, well 52C, and on the other hand, source 64C and drain 66C. Back gate region 68C acquires a charge through the P-N junction located between well 52C and region 68C. To delete the memory cell, a strongly negative potential is applied to well 52C, for example, a potential smaller than −8 V so that the voltage between region 68C and well 52C is greater than the avalanche voltage of the corresponding P-N junction. The removal of charges by leakage through the P-N junction may also be awaited.

Thus, a high positive potential may be applied to the well located under one of the transistors, whatever the potential applied to the neighboring wells.

In the chip area located above N well 54, the transistors are all formed above P-type doped wells. This enables to apply to well N a particularly high potential VMAX and to obtain particularly close P wells. As an example, the distances between neighboring P wells are smaller than 200 nm.

Transistor TC has been described in the context of an operation as a memory cell. If a transistor of the type of transistor TC is desired to be used as a logic transistor, that is, a transistor provided with an N-type doped back gate included in a P-type well, a problem is posed when the potential of well 52C is varied between a high value and a lower value. Indeed, the P-N junction between well 52C and back gate region 68C is reverse biased and the potential of the back gate remains at the high value. It is thus desired to form a transistor having an N-type doped back gate located above a P-type doped well, where the potential of the back gate can be rapidly decreased.

Figure 3:
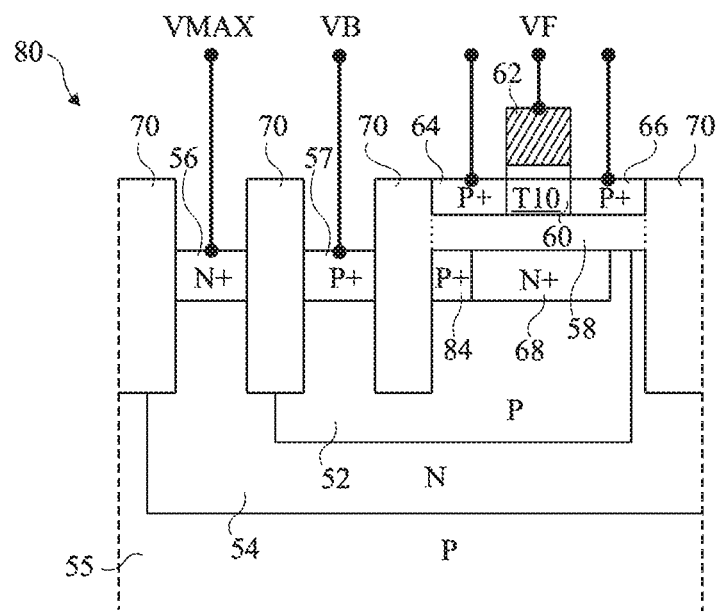
FIG. 3 is a partial simplified cross-section view of an embodiment of a chip comprising a transistor having front and back gates.

FIG. 3 is a partial simplified cross-section view of a chip portion 80 similar to chip portion 50 described in relation with FIG. 2, comprising a transistor provided with an N-type doped back gate region located in a P-type doped well.

Chip 80 comprises a first P-type doped well 52 included in the upper portion of a second N-type doped well 54. Well 54 is located in the upper portion of a P-type doped semiconductor wafer 55, for example, made of silicon. Well 54 is connected by a contact area 56 (N$^+$), more heavily N-type doped than well 54, to a node of application of potential VMAX. Well 52 is connected by a contact area 57 (P$^+$), more heavily P-type doped than well 57, to a node of application of a potential VB. An SOI-type P-channel MOS transistor T10, preferably FDSOI, comprises, on an insulator 58, a channel-formed area 60 which extends under a gate stack 62 between a source area 64 and a drain area 66. Contact areas 56 and 57 and transistor T10 are separated by insulating trenches 70. A back gate region 68 more heavily N-type doped (N$^+$) than well 52 is arranged in the upper portion of P-type well 52 and is located under insulator 58 under transistor T10.

A P-type region 84 which is overdoped, P$^+$, that is, more heavily P-type doped than well 52, adjacent to back gate region 68, is located under insulator 58. The channel-forming area is entirely located above back gate region 68, and overdoped region 84 is located under a portion of source area 64 (as shown in FIG. 3) and/or drain area 66.

When transistor T10 is operating, if a decrease of potential VB applied to gate 52 between a high value and a lower value is caused, as described previously, in the absence of overdoped region 84, the potential of back gate 68 will keep a high value.

Due to the presence of overdoped region 84, charges may flow in both directions through the P$^+$-N$^+$ junction between regions 68 and 84. Thereby, the potential of N$^+$ back gate region 68 follows with a very small time constant potential VB of well 52. Thus, the provision of an overdoped region 84 enables to apply to back gate 68 of transistor T10 any variable potential smaller than or equal, to within 0.3 V, to potential VMAX applied to well 54.

P$^+$ overdoped region 84 for example has a doping level in the range from $10^{19}$ and $10^{20}$ atoms/cm$^3$ and N$^+$ back gate region 68 has a doping level in the range from $10^{19}$ to $10^{20}$ atoms/cm$^3$, or even $10^{21}$ atoms/cm$^3$. Preferably, the implantations intended for the forming of N+ region 68 and of P+ region 84 are slightly overlapping. This results, at the level of the P$^+$-N$^+$ junction, in a degenerated region containing both N-type dopant atoms at a level higher than $10^{19}$ atoms/cm$^3$ and P-type dopant atoms at a level higher than $10^{19}$ atoms/cm$^3$. The degenerated region has a very disturbed crystal structure capable of degrading the characteristics of the P$^+$-N$^+$ junction and of making it conductive in both directions.

Further, as an example, P well 52 may have a doping level in the range from $10^{16}$ to $10^{17}$ atoms/cm$^3$. N well 54 may have a doping level in the range from $10^{16}$ to $10^{17}$ atoms/cm$^3$.

It should be noted that overdoped region 84 may play the role of a back gate portion, as will be described as an example in relation with the following drawings.

Figure 4:
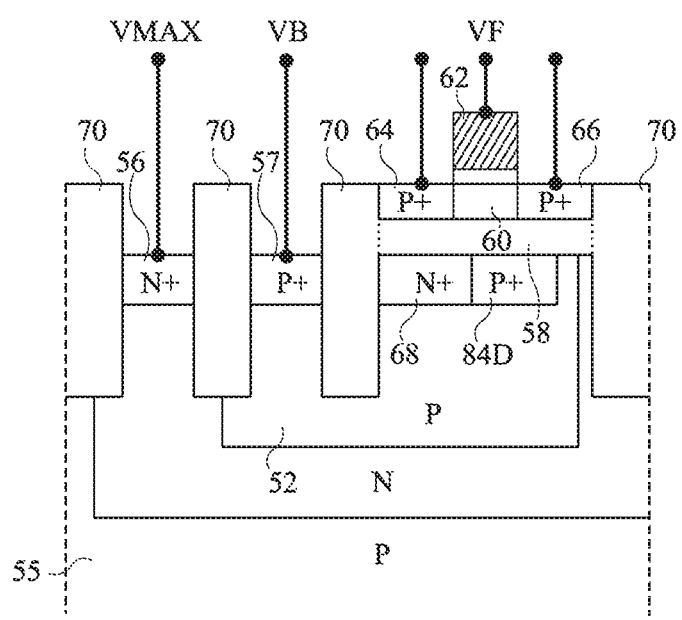
FIG. 4 is a partial simplified cross-section view of another embodiment of a chip comprising a transistor having front and back gates.
Figure 5A:
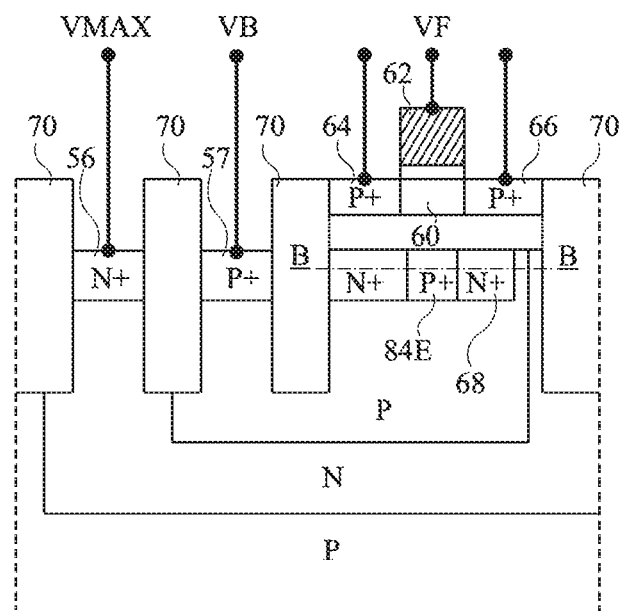
FIGS. 5A and 5B schematically illustrate another embodiment of a chip comprising a transistor having front and back gates.
Figure 5B:
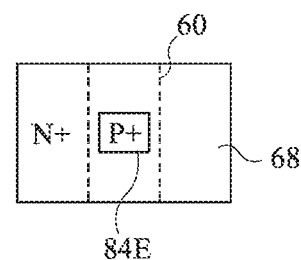

FIGS. 4 and 5A are partial simplified cross-section views of examples of chip portions comprising N-type doped back gate transistors. FIG. 5B is a cross-section view of a back gate region, along a plane B-B shown in FIG. 5A.

The chip portion shown in FIG. 4 is similar to the chip portion visible in partial cross-section in FIG. 3. Overdoped region 84 of transistor T10 has been replaced with an overdoped region 84D having a different layout. Region 84D is located under insulator 58 partly under drain area 66 and partly under channel-forming area 60 of the transistor. The back gate region is partly located under the channel-forming area.

The chip portion illustrated in FIG. 5A is similar to the visible portion in partial cross-section of FIG. 3. Overdoped region 84 has been replaced with an overdoped region 84E, surrounded in top view (FIG. 5B) with N-type doped region 68. Overdoped region 84E occupies a central portion above channel-forming area 60 visible in dotted lines in FIG. 5A.

The N-type region 68 and the P-type region 84 of each of the transistors illustrated in FIGS. 4, 5A, and 5B form together a back gate. Their layout determines the characteristics of the transistor, such as the front gate threshold voltage, or the way in which the current between the drain and the source varies according to the potentials VB and VF applied to the front and back gates. Thus, transistors having optimized characteristics, which are particularly fast or have particularly low power consumptions can advantageously be obtained.

Specific embodiments have been described. Various alterations, modifications, and improvements will occur to those skilled in the art. In particular, although, in the described embodiments, first separate P-type wells are included in a second N-type well biased to a positive potential VMAX, the first separate wells may be of type N included in a second P-type well biased to a negative potential VMIN. Potential VMIN is then smaller than or equal, to within a voltage linked to the voltage drop of a P-N junction, to the potentials applied to the first wells.

Although, in described embodiments, a single overdoped region 84 is juxtaposed to a back gate region 68, two or several overdoped regions may be arranged under the insulator in contact with the back gate region. As an example, two overdoped regions may be arranged symmetrically under the drain and source areas of the transistor.

Further, although the described transistors are based on silicon, other semiconductors may be used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An integrated circuit, comprising:
   a plurality of silicon on insulator (SOI) type MOS transistors;
   an insulator layer supporting said plurality of SOI type MOS transistors;
   a substrate layer supporting said insulator layer, said substrate layer including a plurality of first wells configured to be separately biased, wherein each first well is doped with a first conductivity type, and wherein each first well includes, under the insulator layer of each SOI type MOS transistor, a back gate region that is more heavily doped than the first well, and wherein the first wells are separated from each other by and included within a second well configured to be separately biased and doped with a second conductivity type; and wherein at least one of the back gate regions is doped with the second conductivity type and is positioned adjacent to an overdoped region of the first conductivity type located under a corresponding insulator layer.

2. The integrated circuit of claim 1, wherein the substrate layer is doped with the first conductivity type.

3. The integrated circuit of claim 1, wherein said at least one of the back gate regions is entirely arranged under a channel-forming area.

4. The integrated circuit of claim 1, wherein said at least one of the back gate regions and said overdoped region is partly arranged under a channel-forming area.

5. The integrated circuit of claim 1, wherein said overdoped region is surrounded with said at least one of the back gate regions and is located at a central portion of a channel-forming area.

6. The integrated circuit of claim 1, wherein said overdoped region is doped with the first conductivity type to a doping level greater than $10^{19}$ atoms/cm$^3$ and said at least one of the back gate regions is doped with the second conductivity type to a doping level greater than $10^{19}$ atoms/cm$^3$.

7. The integrated circuit of claim 1, wherein the plurality of SOI type MOS transistors are of FDSOI type.

8. An integrated circuit, comprising:

a first semiconductor layer on an insulating layer, said first semiconductor layer including a source region, a channel region and a drain region;

a second semiconductor layer supporting said insulating layer, said second semiconductor layer including a first well doped with a first conductivity type and configured to be biased, said first well located within a second well doped with a second conductivity type and located within said second semiconductor layer which is doped with the first conductivity type;

an overdoped region doped with the first conductivity type within said first well the overdoped region positioned in contact with a bottom surface of said insulating layer and located under at least the channel region; and a further overdoped region doped with the second conductivity type, the further overdoped region laterally adjacent to and in contact with the overdoped region, the further overdoped region positioned in contact with a bottom surface of said insulating layer.

9. The integrated circuit of claim 8, wherein said overdoped region is further located under said source region.

10. The integrated circuit of claim 8, wherein said overdoped region is further located under said drain region.

11. The integrated circuit of claim 8, wherein the further overdoped region is located under one of said source region and drain region.

12. The integrated circuit of claim 8, wherein the further overdoped region laterally surrounds said overdoped region.

13. An integrated circuit, comprising:

a first semiconductor layer on an insulating layer, said first semiconductor layer including a source region, a channel region and a drain region;

a second semiconductor layer supporting said insulating layer, said second semiconductor layer including a first well doped with a first conductivity type and configured to be biased, said first well located within a second well doped with a second conductivity type and located within said second semiconductor layer which is doped with the first conductivity type;

an overdoped region doped with the second conductivity type within said first well positioned in contact with a bottom surface of said insulating layer and located under at least the channel region; and a further overdoped region doped with the first conductivity type, the further overdoped region laterally adjacent to and in contact with the overdoped region, the further overdoped region positioned in contact with a bottom surface of said insulating layer.

14. The integrated circuit of claim 13, wherein the further overdoped region is located under one of said source region and drain region.

15. The integrated circuit of claim 13, wherein said overdoped region is further located under said source region.

16. The integrated circuit of claim 13, wherein said overdoped region is further located under said drain region.

17. The integrated circuit of claim 13, wherein the further overdoped region laterally surrounds said overdoped region.

* * * * *